United States Patent [19]

O'Shaughnessy et al.

[11] Patent Number: 4,868,482
[45] Date of Patent: Sep. 19, 1989

[54] CMOS INTEGRATED CIRCUIT HAVING PRECISION RESISTOR ELEMENTS

[75] Inventors: Timothy G. O'Shaughnessy, Norco; Michael R. Spaur, Irvine; Kenneth W. Ouyang, Huntington Beach, all of Calif.

[73] Assignee: Western Digital Corporation, Irvine, Calif.

[21] Appl. No.: 104,398

[22] Filed: Oct. 5, 1987

[51] Int. Cl.$^4$ .................................................. G05F 3/16
[52] U.S. Cl. .................................... 323/313; 323/281; 323/315
[58] Field of Search ............... 323/281, 315, 316, 353, 323/354, 313

[56] References Cited

U.S. PATENT DOCUMENTS

| | | | |
|---|---|---|---|
| 3,743,850 | 7/1973 | Davis | 323/315 X |
| 4,112,439 | 9/1978 | Kawasaki et al. | 323/313 X |
| 4,118,712 | 10/1978 | Kawasaki | 323/313 X |
| 4,232,261 | 11/1980 | Lingstaedt et al. | 323/281 X |
| 4,388,539 | 6/1983 | Boeke | 323/313 X |
| 4,471,236 | 9/1984 | Patterson | 323/315 X |
| 4,482,977 | 11/1984 | Ross | 307/498 X |
| 4,523,150 | 6/1985 | Hogeboom | 307/511 X |
| 4,602,207 | 7/1986 | Kim et al. | 323/313 |
| 4,642,551 | 2/1987 | Miller | 323/314 |
| 4,647,841 | 3/1987 | Miller | 323/316 |
| 4,677,368 | 6/1987 | Bynum | 323/315 X |

FOREIGN PATENT DOCUMENTS 0131340 1/1985 European Pat. Off. .

Primary Examiner—Patrick R. Salce
Assistant Examiner—Kristine Peckman
Attorney, Agent, or Firm—Spensley Horn Jubas & Lubitz

[57] ABSTRACT

A circuit is provided for realizing multiple precision resistor elements on an integrated circuit by sensing a reference resistor. The circuit contains a first current source which passes a first current through a reference resistor located either on or off of the integrated circuit to generate a reference voltage. The reference voltage is applied to the inverting input of a precision high gain operational amplifier. A second current source is connected to the drain of a first MOS transistor operating in its ohmic region. The second current source is also connected to the non-inverting input of the high gain operational amplifier. The output of the operational amplifier is electrically connected to the gate of the first and second MOS transistors. In operation, a precision resistance is developed across the second MOS transistor which is equal to or some determinable multiple of the resistance of the reference precision resistor located on or off chip. An operational amplifier adaptable to this circuit is also disclosed.

12 Claims, 5 Drawing Sheets

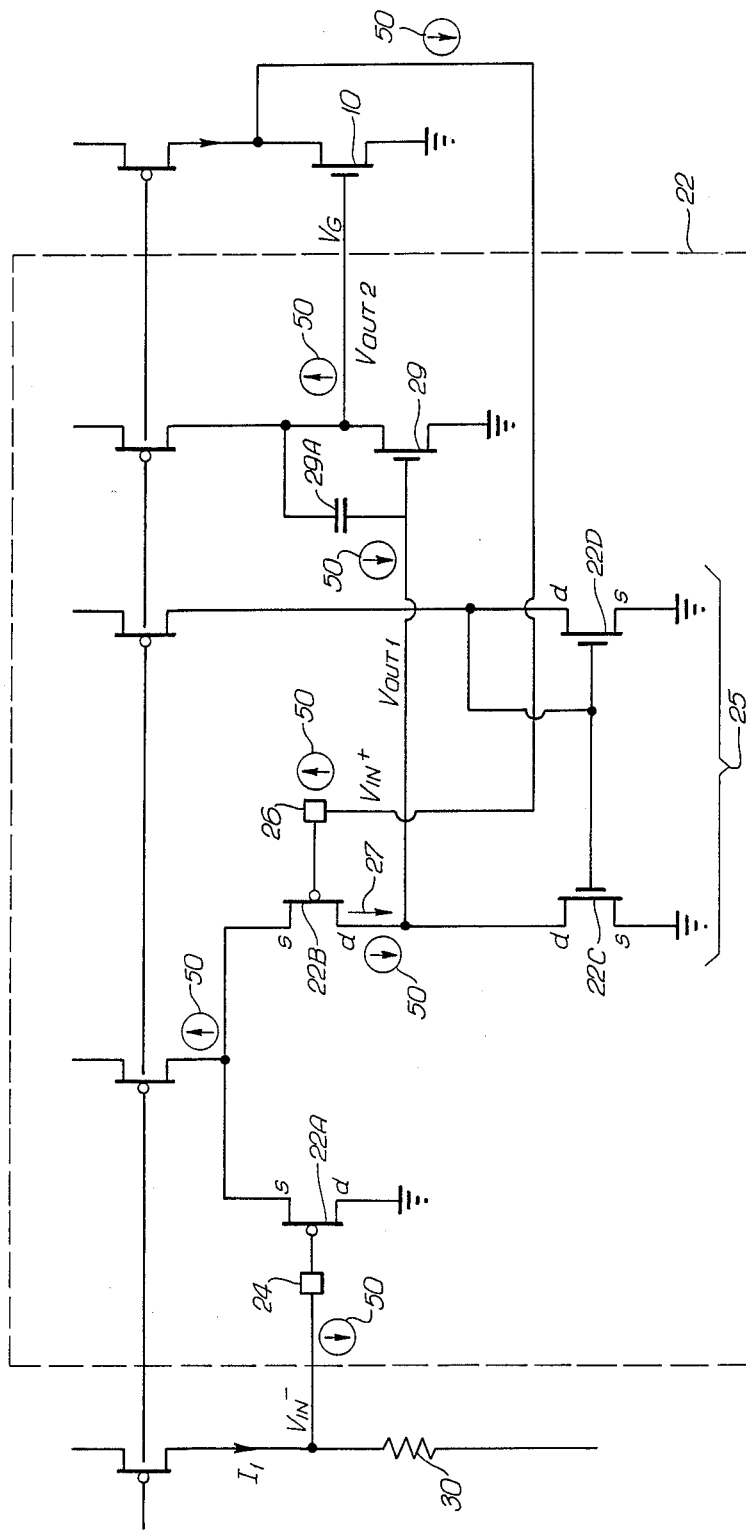

CMOS INTEGRATED CIRCUIT HAVING PRECISION RESISTOR ELEMENTS

BACKGROUND OF THE INVENTION

1. Field of the Invention

The present invention relates to resistor elements and more particularly to a method of forming multiple precision resistor elements on integrated circuits by employing a circuit utilizing at least one MOS transistor element.

In recent years, new and improved methods have been sought for forming precision resistors on integrated circuits. Applications in which such precision resistors may be used include filter circuits, precision current mirrors, and analog-to-digital and digital-to-analog converters, to name but a few.

2. Description of the Prior Art

Several techniques are known for forming precision resistors on integrated circuits in the environment of filters. For example, switched capacitor filters, commonly referred to as switched-C filters, are known which take advantage of the resistance characteristics exhibited by on-chip capacitors in order to form high and low pass filters. In switched-C filters, the terminals of a capacitor are alternately switched between corresponding nodes of the circuit. An alternating charge is produced which is proportional to the difference in voltage at the corresponding nodes. The alternating charge produces a current similar to that which would result if a resistor were placed between the corresponding nodes of the circuit. The current developed is proportional to the voltage difference between the nodes, enabling the capacitor to be utilized as a resistor. The resistive elements realized by the switched capacitor resistance forming technique may be utilized in other circuits such as digital-to-analog converters and analog-to-digital converters where a plurality of devices are slaved.

Switched capacitor filters, however, suffer from several disadvantages. First, an independent clock having a very precise frequency must be provided, increasing the cost associated with such devices. Second, the on-chip capacitors and the clock must be chosen such that the resulting filter frequency is less than half of the clock frequency, or the resulting filter will fail to satisfy the Nyquist criteria. Third, the on-chip capacitors which are utilized must be linear. This requires a second layer polysilicon or buried diffusion, or a very large chip area, all of which are seen as undesirable from a design standpoint.

Unswitched capacitor filters which contain on-chip resistors are also known. The on-chip resistors are typically formed as polysilicon or well resistors or by diffusion. Such resistors, however, also suffer from several disadvantages. For example, they are relatively imprecise due to temperature sensitivity, and process tolerances in diffusion. Furthermore, diffused resistors have high voltage sensitivity, and the polysilicon resistors utilize a large die area.

MOS transistors have also been utilized as on-chip resistors. For example, a plurality of on-chip resistive MOS transistors have been formed by connecting their gates to a common voltage or to an external pin, and trimming the external voltage with an external resistive voltage divider. Use of MOS transistors as resistors, however, has also proven to be disadvantageous. First, the effective resistance of MOS transistors is process dependent. As a result, process variations result in inaccurate and variable resistance values. Moreover, when MOS transistor slaving occurs, a very stable power supply voltage must be applied to the gates of the transistors since changes in the common gate voltage may have a very significant effect on the effective ohmic value of the slaved transistors. In addition, MOS parameters which affect the MOS resistance values are significantly temperature dependent, resulting in very limited operational temperature ranges for the resistors produced.

SUMMARY OF THE INVENTION

The present invention provides a circuit in which precision resistor elements may be formed on an integrated circuit. The present invention accomplishes this function by providing a novel circuit for biasing on-chip MOS transistors to operate in the ohmic region and function as resistors.

More specifically, a MOS transistor is provided on an integrated circuit. The gate of the MOS transistor is electrically connected to the output of a precision high gain operational amplifier. A precision reference resistor is provided either on or off of the integrated circuit through which a first current is passed to generate a reference voltage. The reference voltage is applied to the inverting input of the operational amplifier. A second current is applied to the drain of the MOS device and is also connected to the non-inverting input of the operational amplifier. The MOS device is biased to operate in the ohmic region, facilitating its use as a resistor. The circuit biases the resistance of the the MOS device to be equal to or some determinable multiple or fraction of the resistance of the reference precision resistor. The gates of a plurality of other MOS devices may also be connected to the gate of the at least one MOS device, with the resistance of each MOS device being equal or proportional to the value of resistance of the precision reference resistor. A two stage of inversion high gain operational amplifier containing a single inversion path is also provided in order to assure stability of the circuit during operation.

An advantage of the present invention is the provision of a precision resistor element located on an integrated circuit. A further advantage of the present invention is the provision of an on-chip precision resistor element which is relatively temperature and voltage insensitive. Another advantage of the present invention is the provision of an on-chip precision resistor element which does not require a large amount of die area. A further advantage of the present invention is the provision of an on-chip precision resistor element which does not require an external independent clock. Another advantage of the present invention is the provision of a plurality slaved on-chip precision resistors which are not overly sensitive to variations in the power supply voltage.

The invention will be more readily understood by reference to the description of the preferred embodiment set forth below in conjunction with the accompanying drawings.

BRIEF DESCRIPTION OF THE DRAWINGS

FIG. 5 is a schematic of the circuit of the present invention illustrating the internal circuitry of an operational amplifier which allows the circuit of the present invention illustrated in FIG. 2 to operate properly.

DESCRIPTION OF THE PREFERRED EMBODIMENT

The following description is of the best presently contemplated mode of carrying out the present invention. This description is made for the purposes of illustrating the general principles of the invention and is not to be taken in a limiting sense. The scope of the invention is best determined by reference to the appended claims.

Figure 1:
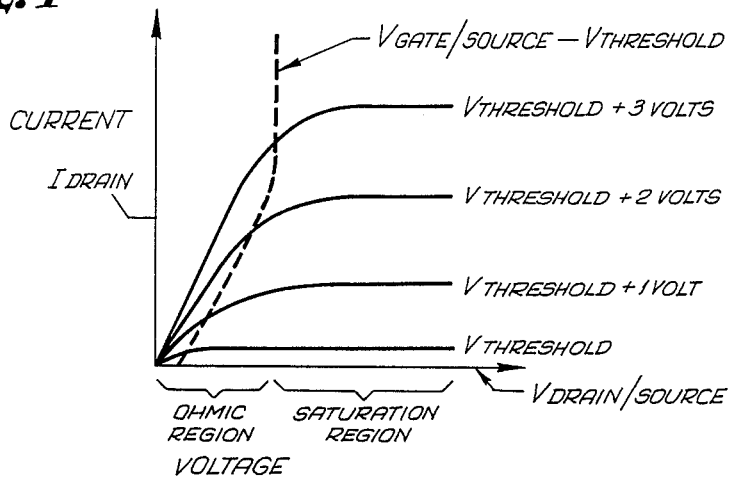
FIG. 1 is a diagram of the voltage-current characteristics of a typical MOS transistor.

FIG. 1 illustrates the typical characteristic of a MOS transistor operating in either the ohmic region or the saturated region. It has long been known that MOS transistor will exhibit resistor characteristics when operated in the ohmic region. The ohmic region corresponds generally to a region of operation in which value of $V_{DS}$ is less than $V_{GS}$-$V_T$, where $V_{DS}$ is the voltage between the drain and the source, $V_{GS}$ is the gate voltage and $V_T$ is the threshold voltage of the MOS transistor. As illustrated in FIG. 1, a somewhat linear relationship exists between the current and voltage level of an MOS transistor when it operates in the ohmic region. By operating the transistor within the ohmic region, it may thus be used as a voltage controlled variable resistor, with its resistance dependent upon the value of its gate voltage $V_{GS}$.

Figure 2:
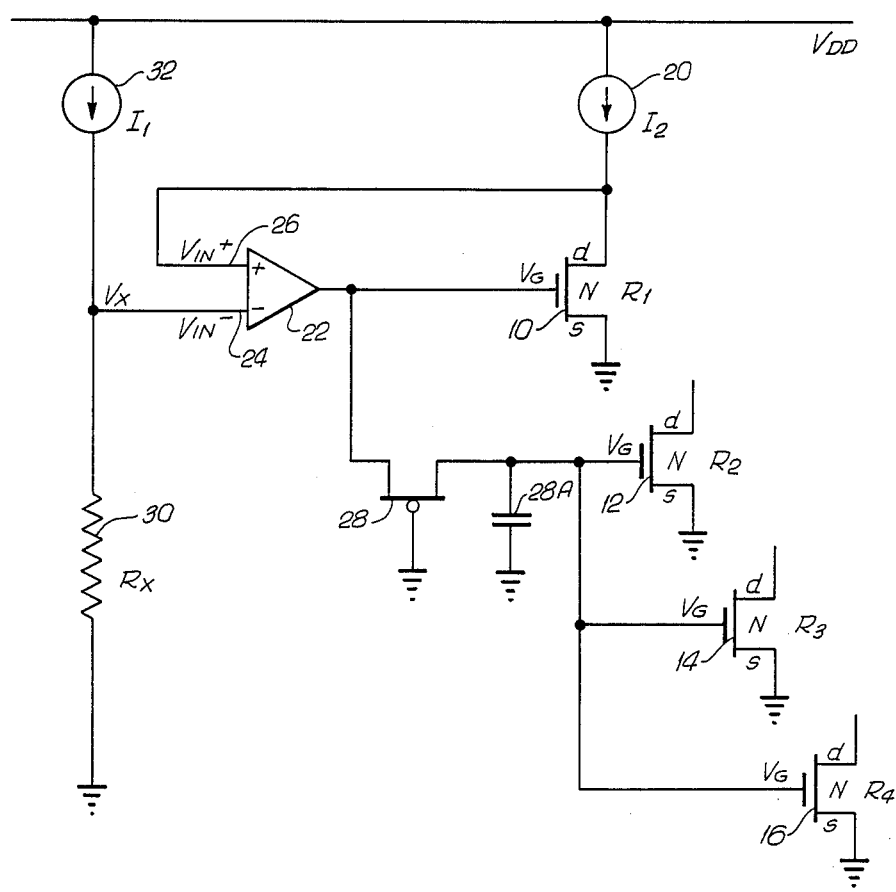
FIG. 2 is a schematic of the circuit of the present invention.

FIG. 2 illustrates the basic configuration of the circuit of the present invention in which one or more on or off-chip precision resistors $R_1$, $R_2$, $R_3$ and $R_4$ may be formed utilizing N-channel MOS transistors 10, 12, 14 and 16, respectively, operating in the ohmic region. A current source 20 having a known current $I_2$ is connected to the drain of the MOS transistor 10. The current source 20 is also electrically connected to the non-inverting input 26 of a high-gain operational amplifier 22. The output of the operational amplifier 22 is connected to the gate of the MOS transistor 10. A reference precision resistor 30 having a known resistance $R_x$ is provided either on or off of the integrated circuit. Another current source 32 is provided which passes a current $I_1$ through the reference resistor 30 to provide a reference voltage $V_x$. Reference voltage $V_x$ is applied to the inverting input 24 of the operational amplifier 22. With this configuration, the circuit of the present invention operates to bias the transistor 10 so that its effective resistance is equal to or some determinable multiple or fraction of the resistance $R_x$ of the reference resistor 30. A capacitor 28A and P-channel MOS transistor 28 are optionally connected to the gates of MOS transistors 12, 14 and 16. These devices operate as low pass filter to filter undesirable oscillations, if any, in the gate voltage of transistor 10 before they are applied to the gates of MOS transistors 12, 14 and 16. Likewise, MOS transistor 28 provides a resistive load to the output of the operational amplifier 22 which prevents instability.

Initially, the reference resistor 30 is shorted to ground and both current sources 20 and 32 are active. The reference voltage $V_x$ across the reference resistor 30, which is applied to the inverting input 24 of the operational amplifier 22, is therefore zero. Since the drain of the MOS transistor 10 is connected to the same ground node as the reference resistor 30, and since the current $I_2$ passes through the MOS transistor 10 at its drain, the voltage at the non-inverting input 26 of the operational amplifier 22 is greater than the voltage $V_{IN}^-$ at the inverting input 24 of the operational amplifier 22. The output voltage of the operational amplifier 22 therefore increases to its upper voltage limit. This high output voltage biases the MOS transistor 10 to its minimum resistance value. The circuit thus initially attempts to replicate the short circuit across resistor 30 with a minimum resistance at the MOS transistor 10. The voltage $V_{in}^+$ at the non-inverting input 26 of the operational amplifier 22 therefore becomes equal to the product of the current $I_2$ times the effective "on" resistance of the MOS transistor 10. The gate voltage $V_{GS}$ of transistor 10 thus has a value which is sufficient to turn on the transistor 10, resulting in some initial value of resistance across the MOS transistor 10.

Upon removing the short across resistor 30, the current source 32 passes current $I_1$ therethrough, increasing the value of the reference voltage $V_x$ at the inverting input 24 of the operational amplifier 22. The difference between voltages at the inverting input 24 and the non-inverting input 26 of the operational amplifier 22 thus decreases, reducing the output voltage of the operational amplifier 22 and thereby increasing the resistance of the MOS transistor 10. A corresponding voltage increase occurs at the drain of the transistor 10 and in the voltage level $V_{in}^+$ at the non-inverting input 26 of the operational amplifier 22. Feedback in this manner increases the voltage level $V_{in}^+$ at the non-inverting input 26 until it approximately equals the voltage level $V^{in-}$ in at the inverting input 24. Due to the self-adjusting nature of the circuit, he operational amplifier produces an output voltage which is applied to the gate of the MOS transistor 10 such that the resistance of MOS transistor 10 tracks the value of the reference resistor, regardless of process parameters and temperature variations.

Since the non-inverting input voltage $V_{in}^+$ always equal to the product of the current $I_2$ and the variable resistance of the transistor 10, biasing the transistor so that the voltage $V_{in}^+$ is approximately equal to some readily determinable voltage $V_{in}^-$ (in this case the product of $I_1$ and $R_x$) enables easy calculation of the precise resistance at the transistor 10, assuming the current ratio $I_2$:$I_1$ is known. For example, if the value of the current $I_1$ at the current source 32 is selected to be approximately equal to the value of current $I_2$ at the current source 20, the equilibrium resistance of the transistor 10 will be approximately equal to the resistance of the precision reference resistor 30. Similarly, if different values of current are chosen for the current source 32 and the current source 20, the value of resistance of the transistor 10 will be approximately equal to the product of the resistance $R_x$ of the precision resistor element 30 and the ratio of the values of the currents $I_1$ and $I_2$ selected for the respective current sources. The value of resistance of the transistor element 10 may therefore be easily calculated if the values of the current at the current sources and the value of the resistance at the reference resistor are known. Moreover, by carefully choosing these values, the resistance at the transistor 10 may be precisely controlled to be equal to any nominal value.

As previously stated, in order for the circuit of the present invention to function properly, it is necessary for the MOS transistor 10 to behave as a resistor. This is accomplished by assuring that the MOS transistor 10 operates within the ohmic region where $V_{DS} < V_{GS} - V_T$. It has been observed that $V_{GS} - V_T$ is also approximately equal $\sqrt{(2I_d L/W)/K'}$, where $I_d$ is the drain current ($I_2$ in this case), L is the gate length, W is the channel width and K' is a process parameter. By making the appropriate substitution, a relationship must therefore also exist where $V_{DS} < \sqrt{(2I_2 L/W)/K'}$ if the MOS transistor 10 is to operate in the ohmic region. By choosing the variable parameters $I_2$ and L to be relatively large or W to be relatively small, this relationship may be easily satisfied and the transistor 10 will exhibit resistance characteristics.

Another relationship must be satisfied by the circuit of the present invention as a consequence of the equilibrium condition that voltage $V_{in}+$ is nearly equal to voltage $V_{in}-$. As previously stated, the voltage $V_{in}+$ at the non-inverting input 26 of the operational amplifier 22 corresponds to the voltage $V_{DS}$ across the transistor, which must be less than $V_{GS}-V_T$ in order for the MOS device 10 to behave as a resistor. In addition, the voltage $V_{in}-$ at the inverting input 24 of the operational amplifier 22 corresponds to the product of the resistance $R_x$ of the reference resistor 30 and the current $I_1$ of the current source 32. Making proper substitutions for the relationship $V_{in}- = V_{in}+$ for the case when the operational amplifier achieves equilibrium, a condition occurs where $R_x I_1 < (V_{GS}-V_T)$. Preferably, this relationship may be attained by selecting a low value of resistance $R_x$ for the precision resistor element 30 since a typical value of current $I_1$ at the current source 32 may be quite large.

As illustrated in FIG. 2, various other on-chip MOS transistor elements 12, 14 and 16 may be provided having gates connected to gate of the MOS transistor 10 in a slave relationship such that they are driven by the operational amplifier 22. By careful selection of the gate lengths and channel widths of these additional MOS transistor elements relative to the gate length and channel width of the MOS transistor element 10, the resulting resistance values of the MOS transistor elements 12, 14 and 16 may be precisely controlled to be equal to or any multiple or sub-multiple of the resistance of the MOS transistor element 10. An integrated circuit may therefore be provided having multiple precision resistor elements of identical or differing values of resistance.

The circuit of the present invention is somewhat unconventional in that negative feedback occurs despite the application of feedback voltage to the non-inverting input 26 of the operational amplifier 22. Feedback theory dictates that proper negative feedback will occur when an odd number of stages of inversion exist along a feedback path. This is normally accomplished by applying feedback to the inverting input of an operational amplifier, since, in the usual case, no additional stages of inversion are added to the feedback path. In the present invention, however, the MOS transistor 10 provides one additional stage of inversion along the feedback path. Connecting the feedback loop to the non-inverting input 26 of the operational amplifier 22 is thus not problematical in the present case since an odd total number of stages of inversion, and therefore negative feedback, is attained.

In order for the circuit of the present invention of FIG. 2 to function properly, it is necessary to provide an operational amplifier which satisfies the Barkhausen stability criteria despite the existence of the additional gain introduced by the MOS transistor 10. The Barkhausen stability criteria dictate that instability may occur during negative feedback when the negative feedback loop, including the operational amplifier, has a gain of greater than unity at multiples of 360° of phase shift. Since negative feedback inherently creates at least 180° of phase shift due to the existence of an odd number of stages of inversion at the operational amplifier, conventional feedback loops have therefore typically been designed to have less than unity gain at 180° of additional phase shift. For passive feedback circuits, the assumed limit is a maximum of three stages of inversion. This is because with a total of three stages of inversion, only 60° of phase shift must be provided per inverting stage to produce oscillation. In the alternate case in which five stages of inversion are provided, only 36° of phase shift may be required per inverting stage to produce oscillation. Thus, the larger the number of stages of inversion which are provided, the more sensitive the device is per stage to additional phase shift. For active feedback systems in which a stage of inversion is added along the feedback path, the assumed maximum limit may be less than three stages of inversion.

Figure 3:
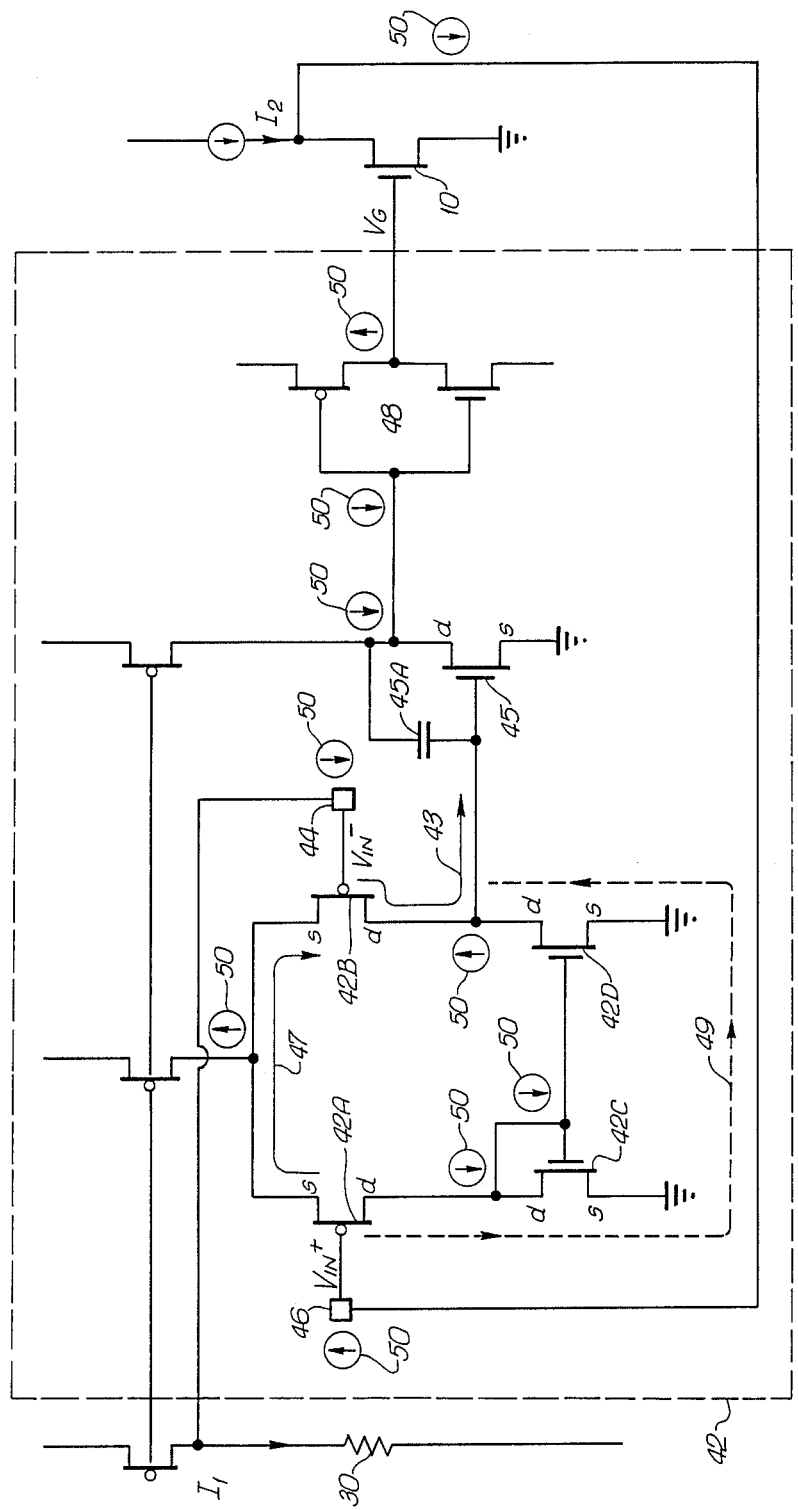
FIG. 3 is a schematic of the present invention incorporating a prior art three stage of inversion operational amplifier in the position of the operational amplifier of the present invention illustrated in FIG. 2.

A first example of a conventional operational amplifier is illustrated in FIG. 3, in which operational amplifier 22 of FIG. 2 has been replaced with a conventional operational amplifier 42. Operational amplifier 42 has three stages of inversion between its inverting input and the output and four stages of inversion between its non-inverting input and the output. The conventional operational amplifier 42 contains a first P-channel MOS transistor 42A, a second P-channel MOS transistor 42B, a first N-channel MOS transistor 42C having its gate and drain shorted in a diode configuration, and a second N-channel MOS transistor 42D. The gates of the transistors 42C and 42D are electrically connected, as are the sources of the transistors 42A and 42B. The drains of transistors 42A and 42B are respectively connected to the drains of transistors 42C and 42D. The non-inverting input 46 of the operational amplifier 42 is electrically connected to the gate of transistor 42A and the inverting input 44 of the operational amplifier 42 is electrically connected to the gate of transistor 42B. The gate of an N-channel transistor 45 is connected to the drains of transistors 42B and 42D and its source is grounded. The source of the transistor 45 is electrically connected to inverter 48 which may be formed as a pair of complementary MOS transistors, as illustrated in FIG. 3.

Arrows surrounded by circles 50 are shown at various locations along the feedback path in order to illustrate points of inversion and added delay. By following a feedback path starting at the inverting input 44 of the operational amplifier 42 and traveling (1) along a path 43 to (2) the N-channel transistor 45 to (3) the inverter 48 to (4) the MOS transistor 10 to (5) the non-inverting input 46 of the operational amplifier 42 and (6) back to the output of the operational amplifier 42 along a primary gain path 47, a total of four stages of inversion are encountered. Since proper negative feedback typically requires the operational amplifier utilized to have a large open-loop gain much greater than unity, a capacitor 45A is placed between the gate and the drain of transistor 45. The capacitor 45 compensates for any undesirable gain which exists at the 180° of additional phase shift. The particular size of the capacitor may be sized to achieve the desired reduction in gain, and may also add up to 90° of phase shift to the feedback loop.

If a similar path is taken to the path described above but replacing step (6) with a subpath along the redundant path 49 from the non-inverting input 46 to the output, two additional stages of gain and phase shift are encountered. Since gain-reducing capacitive compensation is typically only effective for a maximum of three stages of inversion, instability may result if operational amplifier 42 is utilized in the circuit of the present invention. The operational amplifier 42 is not well suited for the circuit of the present invention.

Figure 4:
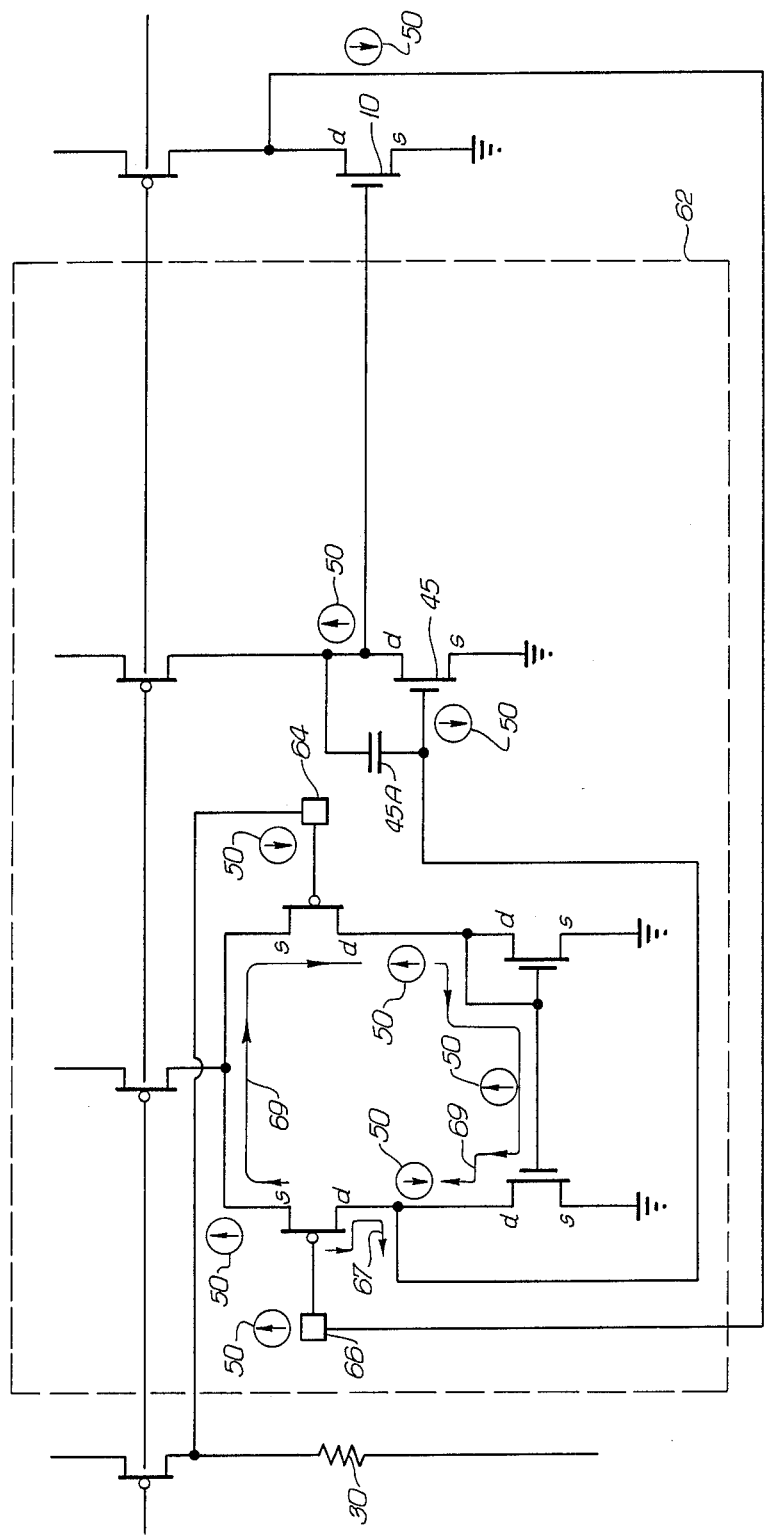
FIG. 4 is a schematic of the present invention incorporating a prior art two stage of inversion operational amplifier in the position of the operational amplifier of the present invention illustrated in FIG. 2.

In FIG. 4, a second conventional operational amplifier 62 is illustrated having three stages of inversion between its inverting input and its output. The operational amplifier 62 also has two stages of inversion between its non-inverting input and its output if either the primary path 67 or the redundant path is followed. Adding one additional stage of inversion to account for the inversion provided by MOS transistor 10, a total of three stages of inversion exist along the feedback loop if either primary path 67 or redundant path 69 is followed. With a maximum total of three stages of inversion along its feedback path, the operational amplifier 62 of FIG. 4 is likely to be adequately compensated for by passive feedback. However, in the instant case, additional gain and phase shift are added to the feedback loop due to the provision of the MOS transistor 10 and current source 32. This additional delay is undesirable because it allows 360° of phase shift to be attained at a lower frequency where the gain of the operational amplifier 62 may not be adequately compensated, thus increasing the likelihood of instability. Since capacitor 45A is typically only utilized for passive feedback systems where no delay is introduced by the external device included along the feedback loop, the phase shift due to delay caused by the inclusion of the development of additional inverting stages along the feedback path will not be recovered. Operational amplifier 62, like operational amplifier 42, is thus not very well suited for use in the circuit of the present invention.

FIG. 5 illustrates a two inversion, stage operational amplifier 22 which is adapted to be utilized in the circuit of the present invention. The operational amplifier 22 which avoids the instability problems associated with the circuits of FIGS. 3 and 4 despite the additional stage of gain and phase shift created by transistor 10. A single ended differential input stage 25 is provided which may have the same gain as the conventional two inversion stage operational amplifier 62 illustrated in FIG. 4. The operational amplifier 22 includes a first MOS P-channel transistor 22A, a second MOS P-channel transistor 22B, a first MOS N-channel transistor 22C and a second MOS N-channel transistor 22D. The gate of transistor 22A is connected to the inverting input 24 of the operational amplifier 22 and the gate of transistor 22B is connected to the non-inverting input of the operational amplifier 22. The drain of the transistor 22A is grounded, and its source is connected to the source of transistor 22B. The drains of transistors 22B and 22C are connected, as are the gates of of transistors 22C and 22D. The sources of transistors 22C and 22D are grounded. The drains of transistors 22B and 22C are connected to the gate of N-channel MOS transistor 29, which corresponds generally to the transistor 45 of conventional operational amplifiers 42 and 62.

By providing the single ended differential input stage 25, the redundant feedback paths and additional stages of inversion or delay of operational amplifier 42 and 62 are eliminated. Only the stages of inversion included along path 27 between the non-inverting input 26 and the output of the operational amplifier 22 need to be considered for stability purposes in conjunction with the gain and inversion of the MOS transistor 10. The instability associated with having three resulting stages of inversion may be easily compensated for by providing a compensation capacitor 29A which corresponds generally to the capacitor 45A of conventional operational amplifiers 42 and 62.

As should be obvious to a person of ordinary skill in the art, the present invention illustrated in FIGS. 2 and 5 is also intended to encompass circuits utilizing the complements of the MOS elements illustrated.

In summary, a reliable technique is provided in which multiple precision resistor elements may be formed on integrated circuits. The resulting resistor elements are more precise than known on-chip resistor elements. The precision resistor elements are also relatively temperature and voltage insensitive and may be formed without utilizing an external clock or a large amount of die area.

Figure 6:
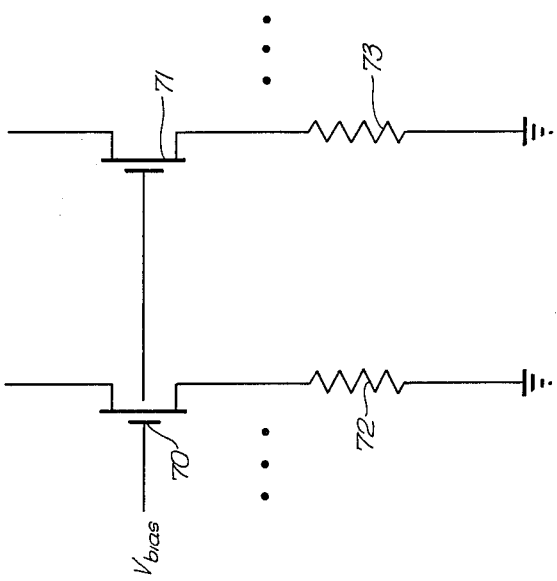
FIG. 6 is a schematic of a portion of a circuit of a prior art digital-to-analog converter.

Typical environments in which the on-chip precision resistors 10, 12, 14, and 16 may be utilized include filter circuits, precision current mirrors, digital-to-analog converters, and analog-to-digital converters (which use digital-to-analog converters). For example, FIG. 6 illustrates a repeating portion of a circuit of a conventional digital-to-analog converter employing unit current sources or binary weighted current sources. Two N-channel MOS devices 70 and 71 are provided which are respectively connected to the on-chip resistors 72 and 73. Each transistor/resistor pair is selectively switched (by means to illustrated) to provide a unit current source. The gates of the MOS devices 70 and 71 are interconnected to one another and are driven by a bias voltage to provide a reference voltage across the resistors, thereby establishing a binary or bit current through the resistors 72 and 73 and the drains of MOS devices 70 and 71. As is often the case with precision DACs, elements may be matched to one another by laser trimming or similar techniques or by using a large amount of chip area and adding additional layers to the fabrication process.

Figure 7:
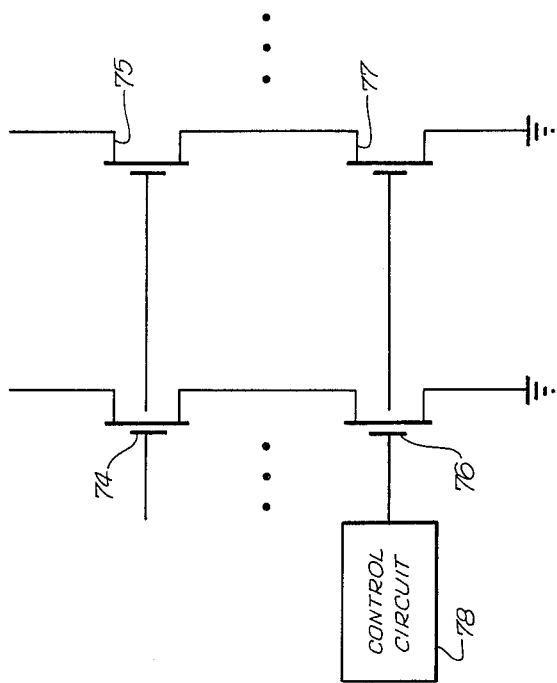
FIG. 7 is a schematic of a portion of a circuit of a digital-to-analog converter utilizing the circuit of FIG. 2.

FIG. 7 illustrates a circuit in which the resistors shown in FIG. 6 have been replaced with MOS transistors 76 and 77. In order to provide the desired resistance value, the transistors 76 and 77 are driven by a control circuit 78 which includes the MOS transistor 10, operational amplifier 22, reference resistor 30 and current sources 20 and 32 of FIG. 2. The transistors 76 and 77 thus correspond to the slaved transistors 12 and 14 of FIG. 2, thus requiring only a a single control circuit. Since the resistors 72 and 73 of FIG. 6 have been replaced with transistors, laser trimming and using additional layers in the fabrication process are not required.

Various other modifications of the illustrated embodiment as well as other embodiments of the invention will be apparent to persons skilled in the art upon reference to this description.

I claim:

1. A circuit for providing a precision resistor on an integrated circuit, comprising:
   a reference resistor;
   a first current source connected to pass a first current through said reference resistor to establish a reference voltage;
   an operational amplifier having an inverting input, a non-inverting input, and an output, said reference voltage being applied to said inverting input of said operational amplifier;
   a MOS transistor having a gate, a source, and a drain, the output of said operational amplifier driving the gate of said MOS transistor;
   a second current source connected to pass a second current to said drain of said MOS transistor and to the non-inverting input of said operational amplifier, wherein the operational amplifier will drive the transistor so that its drain voltage is substantially equal to the reference voltage, thereby causing the transistor to have a constant resistance having a predetermined relationship to the resistance of the reference resistor; and
   at least one additional MOS transistor having its gate driven by the output of the operational amplifier, each additional transistor providing a resistance of predetermined value.

2. A circuit according to claim 1, wherein said reference resistor is located on said integrated circuit.

3. A circuit according to claim 1, wherein said reference resistor is located off of said integrated circuit.

4. A circuit for providing a precision resistor on an integrated circuit, comprising:
   means for providing a reference voltage of predetermined value;
   an operational amplifier having an inverting input, a non-inverting input, and an output, said reference voltage being applied to said inverting input of said operational amplifier;
   a MOS transistor located on said integrated circuit, said MOS transistor having a gate, a source, and a drain, said output of said operational amplifier being electrically connected to said gate of said MOS transistor so as to maintain said MOS transistor at a fixed resistance and wherein said MOS transistor operates in the ohmic region;
   a current source passing a current of predetermined value to said drain of said MOS transistor and said non-inverting input of said operational amplifier; and
   at least one additional MOS transistor having its gate electrically connected to the output of the operational amplifier.

5. A circuit according to claim, 4, wherein said means for providing a reference voltage of predetermined value comprises:
   a reference resistor of predetermined resistance; and
   a second current source having a second current of predetermined value which is applied to said reference resistor.

6. A circuit according to claim 1, or 4, wherein said operational amplifier provides no more than two states of inversion through its non-inverting input.

7. A circuit according to claim 6, wherein said operational amplifier includes a single ended differential input stage.

8. A circuit according to claim 4, further comprising a resistor connected between the output of the operational amplifier and the gate of said at least one additional MOS transistor.

9. A circuit according to claim 8, further comprising means for providing a reference potential, wherein the resistor comprises a supplemental MOS transistor having a gate, a source and a drain, the supplemental MOS transistor having its gate connected to the reference potential to render the supplemental MOS transistor conductive, its source connected to the output of the operational amplifier, and its drain connected to the gate of said at least one additional MOS transistor.

10. A circuit for providing a precision resistor on an integrated circuit, comprising:
    a first MOS transistor operating in the ohmic region;
    means for providing a current of predetermined value to the first MOS transistor to establish a first voltage across the first MOS transistor;
    means for providing a reference voltage;
    biasing means, coupled to the first MOS transistor and the means for providing a reference voltage, for biasing the first voltage across the first MOS transistor to be equal to the reference voltage, thereby causing the first MOS transistor to have a resistance equal to the ratio of the reference voltage over the current of predetermined value; and
    at least one additional MOS transistor biased by the biasing means in a manner identical to the first MOS transistor, each additional MOS transistor having a resistance of predetermined value.

11. A method of driving an MOS transistor to provide a precision resistance, comprising the steps of:
    providing an integrated circuit, a reference precision resistor element having a predetermined value of resistance, a first current of predetermined value,
    providing a first MOS transistor on the integrated circuit, the first MOS transistor operating in the ohmic region and having a value of resistance which is related to the voltage applied to its gate as well as other variable parameters;
    passing the first current through the reference precision resistor to establish a reference voltage;
    passing the second current through the first MOS transistor to establish a transistor drain to source voltage across the MOS transistor;
    biasing the transistor drain to source voltage to be equal to the reference voltage, thereby maintaining the resistance of the first MOS transistor at a constant value irrespective of variations in said other variable parameters, said constant value being substantially equal to the resistance of the reference precision resistor element multiplied by the ratio of the first current of predetermined value over the second current of predetermined value;
    providing at least one additional MOS transistor; and
    biasing each additional MOS transistor to have a resistance which is a determinable multiple of the resistance of the first MOS transistor.

12. A method of providing a precision reference resistor on an integrated circuit, comprising the steps of:
    providing an integrated circuit, a reference precision voltage of predetermined value, and a current of predetermined value;
    providing a first MOS transistor on the integrated circuit, the first MOS transistor operating in the ohmic region and having a gate, a drain and a source and a value of resistance which is related to the voltage applied to the gate;

passing the current of known value through the first MOS transistor to establish a drain to source voltage;

biasing the transistor drain to source voltage to be substantially equal to the reference precision voltage, thereby adjusting the resistance of the first MOS transistor to a constant value equal to the ratio of the reference precision voltage to the current of predetermined value;

providing at least one additional MOS transistor; and biasing each additional MOS transistor to have a resistance which is a determinable multiple of the resistance of the first MOS transistor.

* * * * *